(12) United States Patent
Hula et al.

(10) Patent No.: US 6,326,601 B1
(45) Date of Patent: Dec. 4, 2001

(54) OPTICAL BARRIER

(75) Inventors: David W Hula, Fort Collins; Philip G. Nikkel, Loveland, both of CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/356,560

(22) Filed: Jul. 19, 1999

(51) Int. Cl.[7] ............... H01L 31/02; H01L 21/02
(52) U.S. Cl. ............. 250/208.1; 257/435; 438/69
(58) Field of Search .......... 250/208.1, 208.2, 250/214 R, 214.1; 257/9, 10, 59, 72, 215, 225, 257, 258, 431, 435, 437, 443, 588; 438/57, 69, 72, 582, 297, 633

(56) References Cited

U.S. PATENT DOCUMENTS

| | | | |
|---|---|---|---|
| 4,215,156 | * 7/1980 | Dalal et al. | 438/582 |
| 4,879,470 | 11/1989 | Sugawa et al. | 250/578 |
| 5,159,186 | 10/1992 | Ohzu | 250/208.1 |
| 5,214,272 | 5/1993 | Ueno | 250/208.1 |
| 5,707,883 | * 1/1998 | Tahara | 438/297 |
| 5,734,194 | * 3/1998 | Sanders et al. | 257/588 |
| 6,064,075 | * 5/2000 | Cathey, Jr. et al. | 257/10 |
| 6,191,029 | * 2/2001 | Hsiao et al. | 438/633 |

FOREIGN PATENT DOCUMENTS

| | | | |
|---|---|---|---|
| 0488131A1 | 11/1991 | (EP) . | |
| 59051566 | 3/1984 | (JP) | H01L/27/14 |
| 61084862 | 4/1986 | (JP) | H01L/27/14 |
| 3-150833 | 6/1991 | (JP) | H01L/21/027 |
| 0756333A2 | 7/1996 | (JP) . | |
| WO 90/02418 | 8/1989 | (WO) . | |

* cited by examiner

Primary Examiner—John R. Lee
(74) Attorney, Agent, or Firm—Alexander J. Neudeck

(57) ABSTRACT

An optical barrier made of tungsten (W) or titanium-tungsten (TiW). A layer of the optical barrier material is deposited over a transparent layer such as indium tin oxide (ITO). The optical barrier material is then patterned using photolithography processing steps and hydrogen peroxide as an etchant. The patterned optical barrier material acts as a light-shielding layer over a light-sensing device to form a dark reference device or dark pixel.

38 Claims, 2 Drawing Sheets

OPTICAL BARRIER

FIELD OF THE INVENTION

The present invention pertains generally to integrated circuit fabrication and more specifically to integrated circuits containing optical or imaging devices.

BACKGROUND OF THE INVENTION

Dark pixels are used in light sensing and imaging devices to compensate for signal components that are generated by causes other than light falling on a light sensor. These signal components may be referred to as dark current. To compensate for the dark current, one or more light sensors (also known as pixels) are prevented from receiving any light. These may be referred to as dark pixels. To compensate for the dark current, the outputs from the dark pixels may be subtracted from the outputs of the light receiving pixels to remove a component of the dark current from the outputs of the light receiving pixels.

To form a pixel, a photoelectric device is fabricated with a transparent layer. This transparent layer typically allows light to pass through to a light sensing region while still being conductive. By still being conductive, the transparent layer may be patterned and used as an electrode or other conductor in the formation of the light sensing or imaging device. This transparent layer may be selected from a group that includes indium tin oxide (ITO), indium oxide, tin oxide, zinc oxide, cadmium oxide, cadmium tin oxide, titanium oxide, and gold thin film.

To form a dark pixel, the light-receiving region of a pixel is covered with a light shielding layer that prevents that pixel from receiving light. Prior art devices have constructed this light shielding layer from Aluminum (Al) or an Aluminum alloy such as Al—Si, Al—Ti, Al—Cu, Al—Si—Ti and Al—Si—Cu, or others.

Unfortunately, when it is desirable to place the light-shielding layer over the transparent layer, patterning these light-shielding materials is difficult. Extra processing steps and photomasks may be required to avoid damaging the ITO when the light shielding layer is etched using typical etchants for these materials. Accordingly, there is a need in the art for a light shielding layer that may be easily etched without etching the ITO.

SUMMARY OF THE INVENTION

A preferred embodiment of the invention provides an optical barrier or light-shielding layer. This layer can be applied using conventional integrated circuit processing steps. This layer can also be placed on top of indium tin oxide (ITO) and etched with an etchant that does not react adversely with the ITO. This allows the ITO to be an etch stop layer which simplifies the number of processing steps required to construct a light shielding layer on top of the ITO.

An optical barrier according to the invention is comprised of tungsten (W) or titanium-tungsten (TiW). A layer of the optical barrier material is deposited over ITO. The optical barrier material may then be patterned using well known photolithography photoresist, processing steps, and hydrogen peroxide as an etchant. The patterned optical barrier may then act as a light-shielding layer over a light-sensing device to form a dark pixel.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENTS

Figure 1:
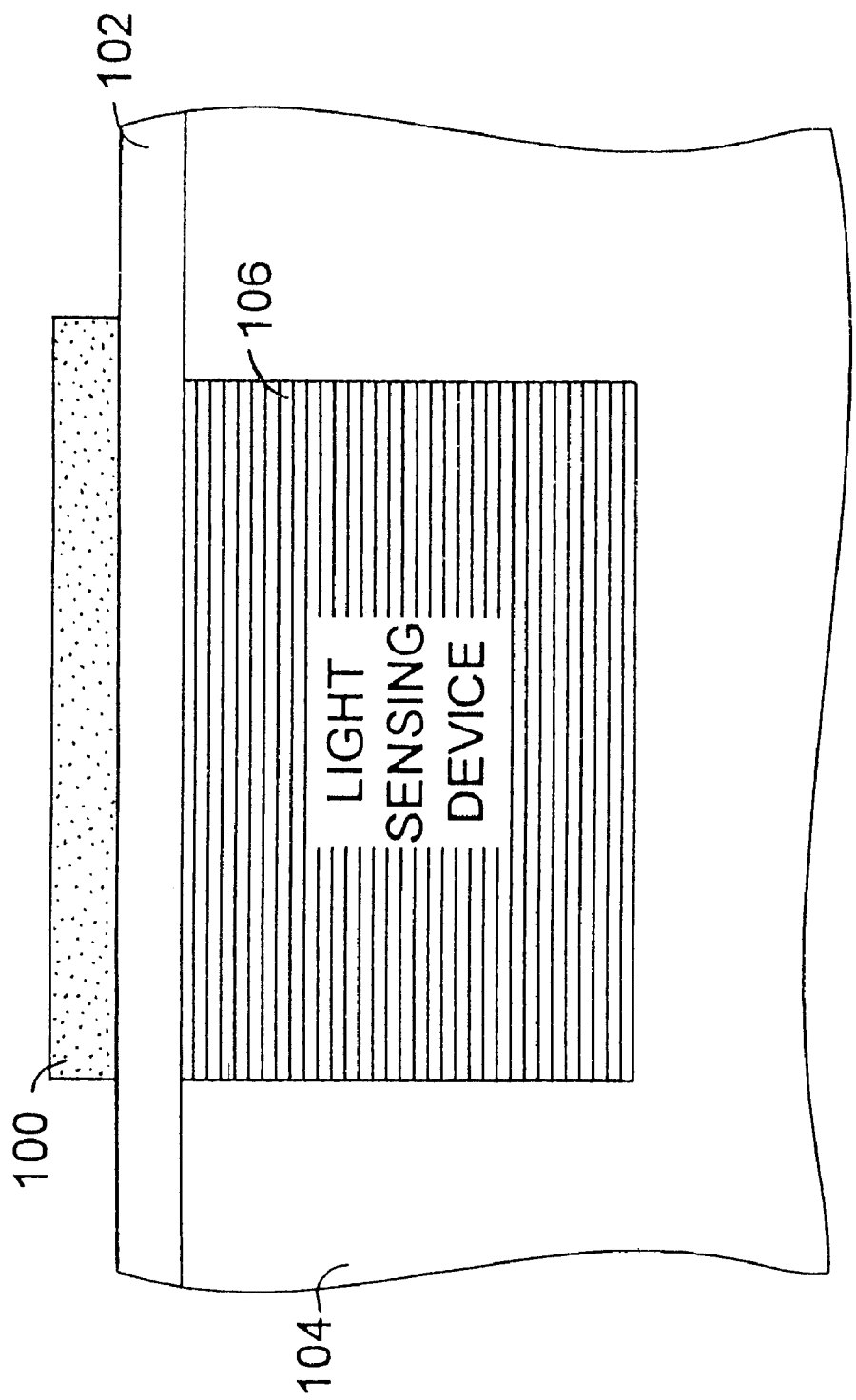
FIG. 1 is a cross-sectional illustration of a dark pixel with an optical barrier.

FIG. 1 is a cross-sectional illustration of a dark pixel with an optical barrier. A light-sensing device 106 is fabricated in or on a substrate 104. This light-sensing device 106 may be any kind of light-sensing device fabricated using any kind of material. Devices that this light-sensing device may be include a photodiode, phototransistor, charge coupled device (CCD), photovoltaic cell, photoresistor, photovaristor, or others. Materials used to construct these devices may include single crystalline silicon, amorphous silicon, polysilicon, cadmium sulfide, lead telluride, gallium arsenide, silicon carbide, germanium, germanium-silicon, or others. In the preferred embodiment, light sensing device 106 is a photodiode constructed using amorphous silicon.

Deposited on top of the light-sensing device is a transparent layer 102. Transparent layer 102 allows light to pass through to a light-sensing region of light-sensing device 106 while still being conductive. By still being conductive, transparent layer 102 may be patterned and used as an electrode or other conductor in the formation of the light-sensing device 106. Transparent layer 102 may be made from a material selected from a group that includes indium tin oxide (ITO), indium oxide, tin oxide, zinc oxide, cadmium oxide, cadmium tin oxide, titanium oxide, gold thin film or others. In the preferred embodiment, transparent layer 102 is made from indium tin oxide (ITO).

On top of transparent layer 102 is optical barrier 100. Optical barrier 100 is made from tungsten (W) or titanium-tungsten (TiW). In the preferred embodiment, optical barrier 100 is made from tungsten. To make optical barrier 100, a layer of W or TiW deposited using a process such as physical vapor deposition (i.e. evaporation or sputtering), low pressure chemical vapor deposition (LPCVD), or others. This layer of W or TiW is then patterned using hydrogen peroxide as an etchant in a standard photoresist technique. In the preferred embodiment, the optical barrier layer is deposited using sputtering.

The layer of W or TiW is patterned such that it at least covers the light-sensing region of light-sensing device 106 forming optical barrier 100. The W or TiW layer may also be optionally patterned to establish conductive traces for wiring circuitry or to construct additional opaque regions. Further processing layers, such as a passivation layer, may optionally be deposited over the light-sensing device 106 and optical barrier 100.

Figure 2:
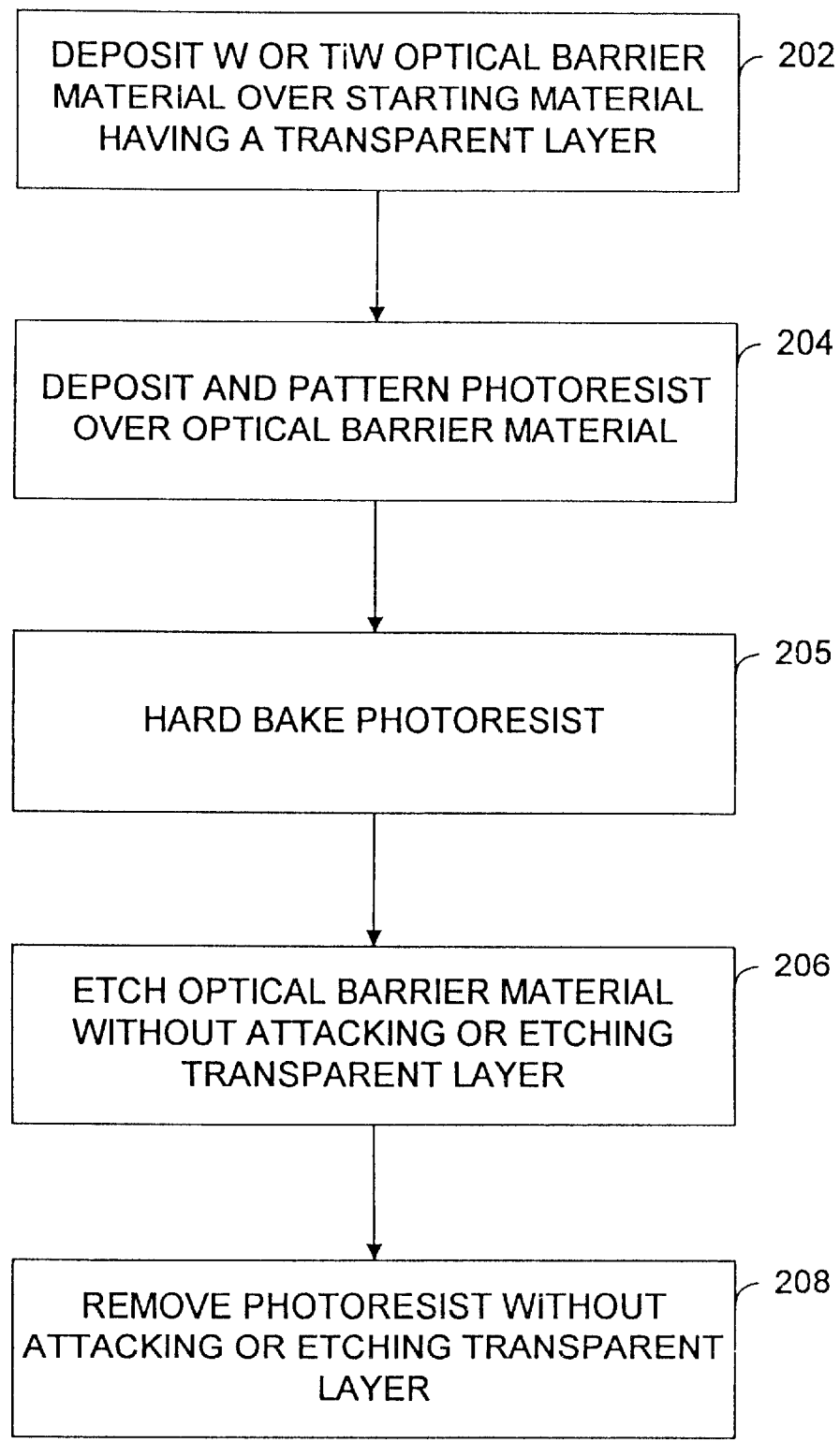
FIG. 2 is a flow-chart illustration of a process that can produce a tungsten or titanium-tungsten optical barrier.

FIG. 2 is a flow-chart illustration of a process that can produce a tungsten (W) or titanium-tungsten (TiW) optical barrier. In a step 202, a layer of tungsten or titanium-tungsten is deposited over starting material having a transparent layer. In the preferred embodiment, this starting material has a top transparent layer of indium tin oxide.

In a step 204, photoresist is deposited, selectively exposed, and developed over the W or TiW layer. Standard photoresist deposition, exposure, development, etc. procedures may be used for this step. In the preferred embodiment, SPR3625 photoresist is used. This photoresist is available from Shipley Co., Marlborough, Mass. In the preferred embodiment this resist is exposed and then developed using OPD262 available from Arch Chemicals, Norwalk, Conn. These processes pattern the photoresist such that it remains over the areas that the optical barrier and other W or TiW structures are desired.

In a step 205, the photoresist is hard baked such that it is made more resistant to attack by the wet etch. In the preferred embodiment, the photoresist is baked under ultraviolet (UV) light at 200° centigrade for 90 seconds.

In a step 206, the W or TiW layer is etched using a hydrogen peroxide solution. In the preferred embodiment, a 31% hydrogen peroxide solution at 40° C. is used to etch for 3.5 minutes. This removes the portions of the W or TiW layer that are not protected by the patterned photoresist resulting in the W or TiW layer being patterned. In the preferred embodiment, hydrogen peroxide is used as an etchant because it does not significantly attack the transparent layer.

In a step 208, the photoresist is removed leaving a patterned W or TiW layer. In the preferred embodiment the photoresist is removed using a wet chemical resist strip process with ACT NP-937 available from Ashland-ACT, Easton, Pa. a business unit of the Electronic Chemicals Division of Ashland Chemical Company, (formerly Advanced Chemical Technologies). In the preferred embodiment, the layer of W or TiW is patterned such that it at least covers the light-sensing region of light-sensing device forming an optical barrier over a dark pixel. Further processing steps, such as adding a passivation layer, may then be employed to construct more device features in, around, and on the optical barrier.

Although several specific embodiments of the invention have been described and illustrated, the invention is not to be limited to the specific forms or arrangements of parts so described and illustrated. The invention is limited only by the claims.

What is claimed is:

1. An optical barrier, comprising:
   a patterned layer of tungsten wherein said patterned layer lies over a light-sensing device and is configured to prevent light from impinging upon a light-receiving region of said light-sensing device.
2. The optical barrier of claim 1 wherein said light-sensing device is a photodiode, phototransistor, charge coupled device, photovoltaic cell, photoresistor, or photovaristor.
3. The optical barrier of claim 1 wherein said light-sensing device is integrated into an integrated circuit.
4. The optical barrier of claim 3 wherein said integrated circuit has a transparent layer and said patterned layer is in contact with said transparent layer.
5. The optical barrier of claim 4 wherein said transparent layer is indium tin oxide, indium oxide, tin oxide, zinc oxide, cadmium oxide, cadmium tin oxide, titanium oxide, or gold.
6. An optical barrier, comprising:
   a patterned layer of titanium-tungsten wherein said patterned layer lies over a light-sensing device and is configured to prevent light from impinging upon a light-receiving region of said light-sensing device.
7. The optical barrier of claim 6 wherein said light-sensing device is integrated into an integrated circuit.
8. The optical barrier of claim 7 wherein said integrated circuit has a transparent layer and said patterned layer is in contact with said transparent layer.
9. The optical barrier of claim 8 wherein said transparent layer is indium tin oxide, indium oxide, tin oxide, zinc oxide, cadmium oxide, cadmium tin oxide, titanium oxide, or gold.
10. The optical barrier of claim 6 wherein said light-sensing device is a photodiode, phototransistor, charge coupled device, photovoltaic cell, photoresistor, or photovaristor.
11. A dark pixel, comprising:
    a light-sensing device having a light-receiving region;
    a light-shielding layer, said light-shielding layer being positioned over said light-receiving region and wherein said light-shielding layer is comprised of tungsten.
12. The dark pixel of claim 11 further comprising
    a transparent layer, said transparent layer being between said light-sensing device and said light-shielding layer.
13. The dark pixel of claim 12 wherein said light-shielding layer is in contact with said transparent layer.
14. The dark pixel of claim 13 wherein said light-shielding layer is patterned.
15. The dark pixel of claim 12 wherein said transparent layer is indium tin oxide, indium oxide, tin oxide, zinc oxide, cadmium oxide, cadmium tin oxide, titanium oxide, or gold.
16. The dark pixel of claim 11 wherein said light-sensing device is a photodiode, phototransistor, charge coupled device, photovoltaic cell, photoresistor, or photovaristor.
17. A dark pixel, comprising:
    a light-sensing device having a light-receiving region;
    a light-shielding layer, said light-shielding layer being positioned over said light-receiving region and wherein said light-shielding layer is comprised of titanium-tungsten.
18. The dark pixel of claim 17 further comprising
    a transparent layer, said transparent layer being between said light-sensing device and said light-shielding layer.
19. The dark pixel of claim 18 wherein said light-shielding layer is in contact with said transparent layer.
20. The dark pixel of claim 19 wherein said light-shielding layer is patterned.
21. The dark pixel of claim 18 wherein said transparent layer is indium tin oxide, indium oxide, tin oxide, zinc oxide, cadmium oxide, cadmium tin oxide, titanium oxide, or gold.
22. The dark pixel of claim 17 wherein said light-sensing device is a photodiode, phototransistor, charge coupled device, photovoltaic cell, photoresistor, or photovaristor.
23. A method of forming an optical barrier, comprising:
    depositing an optical barrier material comprised of tungsten over a transparent layer;
    patterning said optical barrier material wherein said patterning leaves said optical barrier material over at least one light-sensing device.
24. The method of claim 23 wherein said patterning includes etching said optical barrier material with an etchant that does not etch said transparent layer.
25. The method of claim 24 wherein said etchant is a hydrogen peroxide solution.
26. The method of claim 23 wherein said step of depositing an optical barrier material comprises depositing said material using physical vapor deposition or low pressure chemical vapor deposition.
27. The method of claim 23 wherein said light-sensing device is a photodiode, phototransistor, charge coupled device, photovoltaic cell, photoresistor, or photovaristor.
28. The method of claim 23 wherein said transparent layer is indium tin oxide, indium oxide, tin oxide, zinc oxide, cadmium oxide, cadmium tin oxide, titanium oxide, or gold.
29. A method of forming an optical barrier, comprising:
    depositing an optical barrier material comprised of titanium-tungsten over a transparent layer;
    patterning said optical barrier material wherein said patterning leaves said optical barrier material over at least one light-sensing device.

30. The method of claim 29 wherein said patterning includes etching said optical barrier material with an etchant that does not etch said transparent layer.

31. The method of claim 30 wherein said etchant is a hydrogen peroxide solution.

32. The method of claim 29 wherein said step of depositing an optical barrier material comprises depositing said material using physical vapor deposition or low pressure chemical vapor deposition.

33. The method of claim 29 wherein said light-sensing device is a photodiode, phototransistor, charge coupled device, photovoltaic cell, photoresistor, or photovaristor.

34. The method of claim 29 wherein said transparent layer is indium tin oxide, indium oxide, tin oxide, zinc oxide, cadmium oxide, cadmium tin oxide, titanium oxide, or gold.

35. A method of producing an optical barrier, comprising:

depositing an optical barrier material of tungsten or titanium-tungsten onto a transparent layer disposed on a light-sensing device material;

depositing a photoresist material over said optical barrier material;

patterning said photoresist material;

hard-baking said photoresist material to increase its resistance to being etched;

ecthing said optical barrier material;

removing said photoresist material from said optical barrier material.

36. The method of claim 35 wherein said step of depositing an optical barrier material comprises depositing said material using physical vapor deposition or low pressure chemical vapor deposition.

37. The method of claim 35 wherein said transparent layer is indium tin oxide, indium oxide, tin oxide, zinc oxide, cadmium oxide, cadmium tin oxide, titanium oxide, or gold.

38. The method of claim 35 wherein said light-sensing device material is single crystalline silicon, amorphous silicon, polysilicon, cadmium sulfide, lead telluride, gallium arsenide, silicon carbide, germanium, or germanium-silicon.

* * * * *